(12) United States Patent
Hatada et al.

(10) Patent No.: US 7,262,465 B2
(45) Date of Patent: Aug. 28, 2007

(54) P-CHANNEL MOS TRANSISTOR AND FABRICATION PROCESS THEREOF

(75) Inventors: Akiyoshi Hatada, Kawasaki (JP);
Akira Katakami, Kawasaki (JP);
Naoyoshi Tamura, Kawasaki (JP);
Yosuke Shimamune, Kawasaki (JP);
Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 11/114,047

(22) Filed: Apr. 26, 2005

(65) Prior Publication Data

US 2006/0163557 A1 Jul. 27, 2006

(30) Foreign Application Priority Data

Jan. 27, 2005 (JP) ............................. 2005-019855

(51) Int. Cl.
*H01L 27/01* (2006.01)
(52) U.S. Cl. .................. 257/347; 257/616; 257/401
(58) Field of Classification Search .............. 257/19, 257/346, 353, 368, 401, 396, 387, 330, E21.182, 257/E29.193; 438/197, 198, 478–481
See application file for complete search history.

(56) References Cited

U.S. PATENT DOCUMENTS 6,603,156 B2 * 8/2003 Rim ............................ 257/190
6,621,131 B2 * 9/2003 Murthy et al. ............... 257/408

FOREIGN PATENT DOCUMENTS

| JP | 8-167718 | 6/1996 |
|----|----------|--------|
| JP | 2003-179157 | 6/2003 |
| JP | 2004-31753 | 1/2004 |

* cited by examiner

*Primary Examiner*—Zandra V. Smith
*Assistant Examiner*—Paul E Patton
(74) *Attorney, Agent, or Firm*—Westerman, Hattori, Daniels & Adrian, LLP.

(57) ABSTRACT

A p-channel MOS transistor includes a strained SOI substrate formed of a SiGe mixed crystal layer and a strained Si layer formed on the SiGe mixed crystal layer via an insulation film, a channel region being formed in the strained Si layer, a gate electrode formed on the strained Si layer in correspondence to the channel region via a gate insulation film, and first and second p-type diffusion regions formed in the strained Si layer at respective first and second sides of the channel region, wherein the strained Si layer has first and second sidewall surfaces respectively at the first and second sides thereof, a first SiGe mixed crystal region being formed epitaxially to the SiGe mixed crystal layer in contact with the first sidewall surface, a second SiGe mixed crystal region being formed epitaxially to the SiGe mixed crystal layer in contact with the second sidewall surface, the first and second SiGe mixed crystal regions being in lattice matching with the strained silicon layer respectively at the first and second sidewall surfaces.

7 Claims, 11 Drawing Sheets

P-CHANNEL MOS TRANSISTOR AND FABRICATION PROCESS THEREOF

CROSS-REFERENCE TO RELATED APPLICATION

The present application is based on Japanese priority application No. 2005-019855 filed on Jan. 27, 2005, the entire contents of which are hereby incorporated by reference.

BACKGROUND OF THE INVENTION

The present invention generally relates to semiconductor devices and more particularly to a semiconductor device having improved operational speed by straining and the fabrication process of such a semiconductor device.

With progress in the art of device miniaturization, it is now possible to fabricate ultrafine and ultra high-speed semiconductor devices having a gate length of 100 nm or less.

In such ultrafine and ultra high-speed transistors, the area of the channel region right underneath the gate electrode is reduced as compared with conventional semiconductor devices, and the mobility of electrons or holes traveling through the channel region is influenced heavily by the stress applied to such a channel region.

Thus, there are various attempts made for improving the operational speed of the semiconductor device by optimizing the stress applied to such a channel region.

In semiconductor devices that use a silicon substrate as a channel region, the mobility of holes is generally smaller than the mobility of electrons, and thus, it is particularly important to improve the operational speed of p-channel MOS transistors, in which holes are used for the carriers, in the designing of semiconductor integrated circuits.

With such p-channel MOS transistors, it is known that the mobility of carriers is improved by applying a uniaxial compressive stress to the channel region, and there is a proposal to use the construction of FIG. 1 as the means of applying the compressive stress to the channel region.

Referring to FIG. 1, there is formed a gate electrode 3 on a silicon substrate 1 via a gate insulation film 2, and p-type diffusion regions 1a and 1b are formed in the silicon substrate 1 at both lateral sides of the gate electrode 3 so as to define the channel region. Further, sidewall insulation films 3A and 3B are formed on the sidewall surfaces of the gate electrode 3 so as to cover also a surface part of the silicon substrate 1.

Thereby, the diffusion regions 1a and 1b function respectively as a source extension region and a drain extension region of the MOS transistor, and the flow of the holes transported through the channel region right underneath the gate electrode 3 from the diffusion region 1a to the diffusion region 1b is controlled by the gate voltage applied to the gate electrode 3.

Further, there are formed SiGe mixed crystal regions 1A and 1B in the silicon substrate 1 in the construction of FIG. 1 at respective outer sides of the sidewall insulation films 3A and 3B with epitaxial relationship with the silicon substrate 1, and p-type source and drain regions are formed in the SiGe mixed crystal regions 1A and 1B respectively in continuation from the diffusion region 1a and the diffusion region 1b.

Because the SiGe mixed crystal regions 1A and 1B have a larger lattice constant larger than that of the silicon substrate 1 in the MOS transistor of the construction of FIG. 1, the SiGe mixed crystal regions 1A and 1B are applied with a compressive stress shown in FIG. 1 by an arrow a, and as a result, the SiGe mixed crystal regions 1A and 1B undergo deformation in the direction generally perpendicular to the surface of the silicon substrate 1 as shown by an arrow b.

Because the SiGe mixed crystal regions 1A and 1B are thus formed epitaxially on the silicon substrate 1, such a deformation of the SiGe mixed crystal regions 1A and 1B represented by the arrow b induces a corresponding deformation in the channel region of the silicon substrate as represented by an arrow c, while such a deformation in the channel region induces a uniaxial compressive stress in the channel region as represented by an arrow d.

As a result of such a uniaxial compressive stress applied to the channel region of the MOS transistor of FIG. 1, the symmetry of the Si crystal constituting the channel region is locally modulated, and as a result of such local modulation of the symmetry, degeneration of heavy holes and light holes in the valence band is resolved. Thereby, there is caused increase of hole mobility in the channel region, leading to improvement of operational speed of the transistor.

It should be noted that such increase of hole mobility caused in the channel region by locally induced stress appears particularly conspicuously in the ultrafine semiconductor devices having a gate length of 100 nm or less.

REFERENCES (Patent Reference 1) U.S. Pat. No. 6,621,131
(Patent Reference 2) Japanese Laid-Open Patent Application 2004-31753
(Patent Reference 3) Japanese Laid-Open Patent Application 8-167718
(Patent Reference 4) Japanese Laid-Open Patent Application 2003-179157
(Non-Patent Reference 1) Thompson, S. E., et al., IEEE Transactions on Electron Devices, vol. 51, No. 11, November, 2004, pp. 1790-1797

SUMMARY OF THE INVENTION

It is an object of the present invention to provide a structure of a strained p-channel MOS transistor in which the strain of the channel region is increased further.

Conventionally, there is a known technology of compressed SOI substrate shown in FIGS. 2A-2D that uses a SiGe virtual substrate.

Referring to FIG. 2A, a SiGe layer 11 is formed epitaxially on a silicon substrate not illustrated, and a Si layer 12 is formed epitaxially on the SiGe layer 11. Here, it should be noted that the SiGe layer 11 is a layer formed over the silicon substrate via intervening compositional gradation layer and a SiGe buffer layer, and thus, the strain caused by lattice misfit between the silicon substrate and the SiGe layer 11 is substantially relaxed at least at the surface part thereof. Thus, the atomic spacing between the Si or Ge atoms generally represented by shaded circles is substantially coincident to the lattice constant of a SiGe mixed crystal of that composition at least at the surface part of the SiGe layer 11.

Thus, the Si layer 12 formed epitaxially on the SiGe layer 11 is expanded in an in-plane direction of the silicon substrate as represented by an arrow e, and with this, the Si layer 12 undergoes contraction in the direction perpendicular to the substrate surface as shown in the drawing by another arrow f.

Next, in the step of FIG. 2B, a silicon substrate 13 carrying a thermal oxide film 14 on a surface thereof is mounted upon the strained Si layer 12 thus formed in an upside down state, and the thermal oxide film 14 is bonded to the surface of the strained Si layer 12 by means of diffusion bonding, or the like. As a result, the Si layer 12 is bonded to the thermal oxide film 14 firmly and the structure shown in FIG. 2C is obtained.

Further, in the step of FIG. 2D, the structure of FIG. 2C is turned over, and the SiGe layer 11 on the strained Si layer 12 is removed together with the silicon substrate (not shown) further thereon.

With this, a strained SOI substrate (SSOI) having a strained silicon device layer is obtained as shown in FIG. 3.

Thus, it is conceivable to realize a high-speed p-channel MOS transistor having strain in the channel region explained with reference to FIG. 1 by using the SSOI substrate of FIG. 3.

Here, it should be noted that, while a compressive stress has been applied to the channel region from the SiGe regions 11A and 11B located at the respective lateral sides in the construction of FIG. 1 for causing the localized symmetry modulation of the Si crystal constituting the channel region, it should be noted that such localized modulation of crystal symmetry of the Si crystal in the channel region can be achieved also by applying a tensile stress thereto. Thereby, there is also caused separation of valence band between the light holes and heavy holes by using such a SSOI substrate.

However, such a construction of the strained Si layer 12 has a drawback in that the strained Si layer 12 undergoes contraction shown by an arrow f when the in-plane expansion is caused therein as shown by the arrow e, When this occurs, the in-line tensile stress thus induced is relaxed inevitably with a corresponding amount. Thus, with such a construction, it is not possible to fully exploit the effect of strain induced in the strained Si layer 12 used for the channel layer for improvement of the device characteristics.

In an aspect, the present invention provides a p-channel MOS transistor, comprising:

a strained SOI substrate, said strained SOI substrate comprising a SiGe mixed crystal layer and a strained Si layer formed on said SiGe mixed crystal layer via an insulation film, a channel region being included in said strained Si layer;

a gate electrode formed on said strained Si layer in correspondence to said channel region via a gate insulation film; and first and second p-type diffusion regions formed in said strained Si layer at respective first and second sides of said channel region, said strained Si layer having first and second sidewall surfaces respectively at said first and second sides thereof, a first SiGe mixed crystal region being formed epitaxially to said SiGe mixed crystal layer in contact with said first sidewall surface, a second SiGe mixed crystal region being formed epitaxially to said SiGe mixed crystal layer in contact with said second sidewall surface, said first and second SiGe mixed crystal regions being in lattice matching with said strained silicon layer respectively at said first and second sidewall surfaces.

According to an aspect of the present invention, it becomes possible to apply an in-plane tensile stress uniformly to a channel region of a p-channel MOS transistor by forming the channel region on a strained Si layer on a SiGe mixed crystal layer, and mobility of the holes in such a channel region is improved significantly. Thereby, by growing SiGe mixed crystal regions at both lateral sides of the strained Si layer constituting the channel region epitaxially to the underlying SiGe mixed crystal layer with lattice matching to the respective sidewall surfaces of the strained Si layer, the problem of stress relaxation, which would be caused when the sidewall surface of the Si layer is not constrained by the vertical contraction of the strained Si layer is prevented, and the stress in the channel region can be increased further.

Other objects and further features of the present invention will become apparent from the following detailed description when read in conjunction with the attached drawings.

DETAILED DESCRIPTION OF THE INVENTION

First Embodiment

Figure 1:
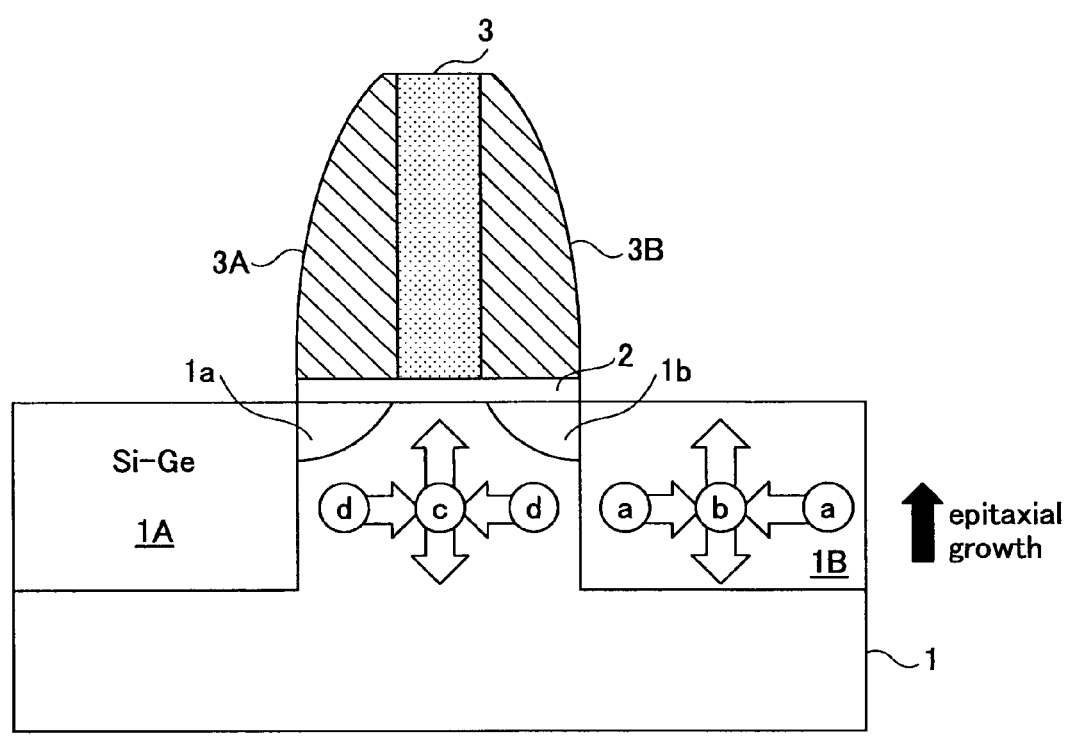
FIG. 1 is a diagram showing the principle of a strained p-channel MOS transistor utilizing the compressive stress of SiGe.
Figure 2A:
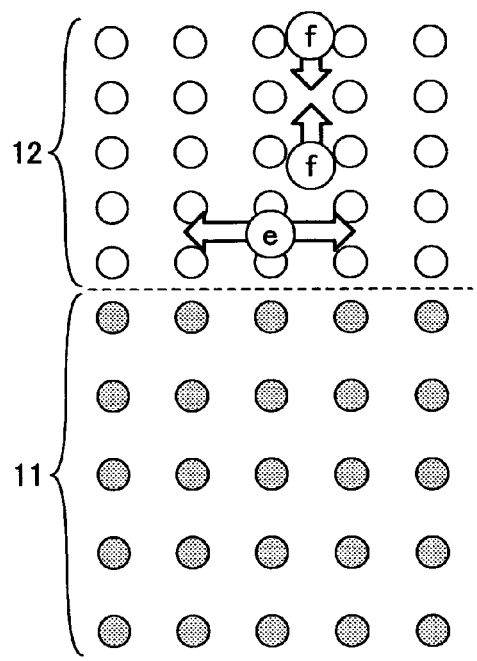
FIGS. 2A-2D are diagrams explaining the fabrication method and principle of a conventional strained SOI substrate.
Figure 2B:
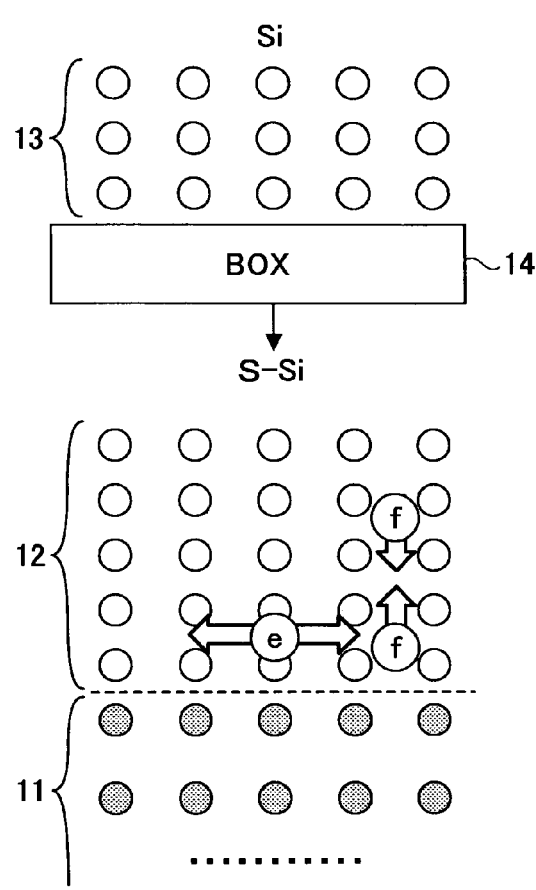
Figure 2C:
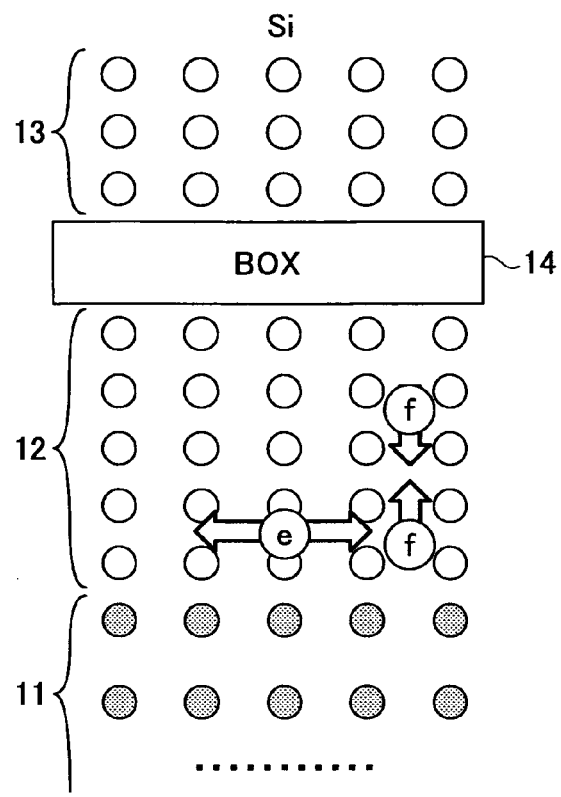
Figure 2D:
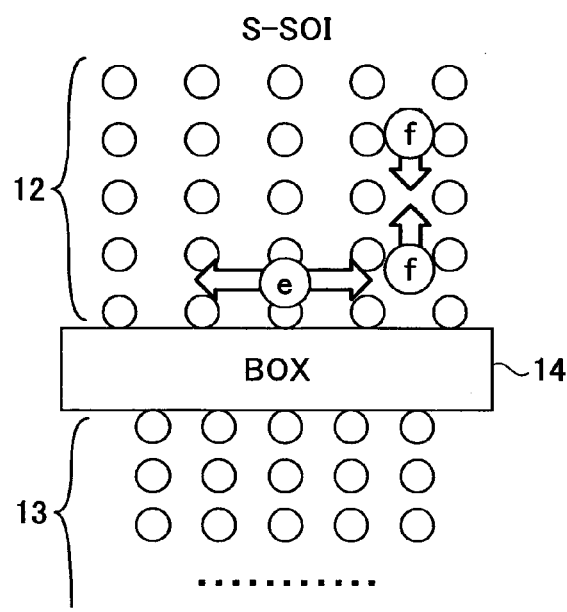
Figure 3:
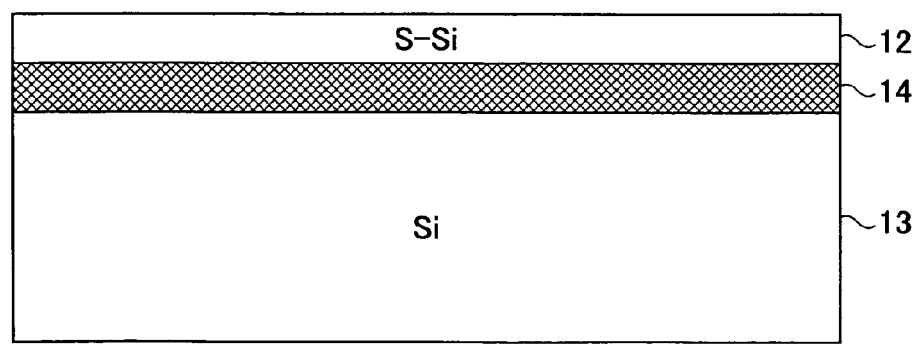
FIG. 3 is a diagram showing the construction of a conventional strained SOI substrate.
Figure 4:
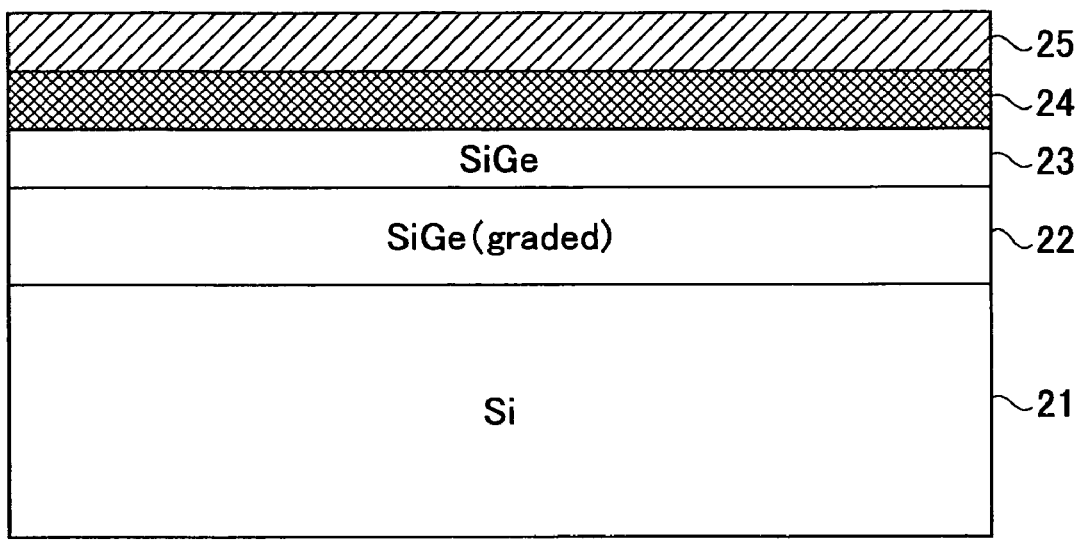
FIG. 4 is a diagram showing the construction of a strained SOI substrate that is used with the present invention.
Figure 5A:
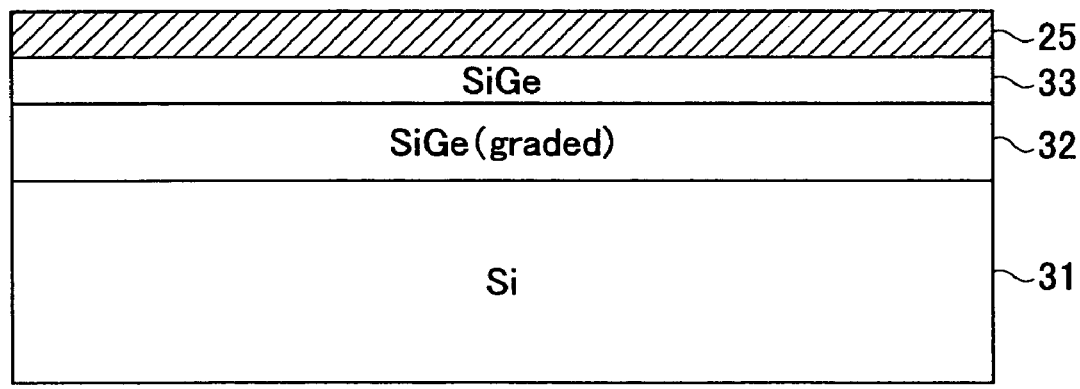
FIGS. 5A-5C are diagrams showing the fabrication process of the strained SOI substrate of FIG. 4.
Figure 5B:
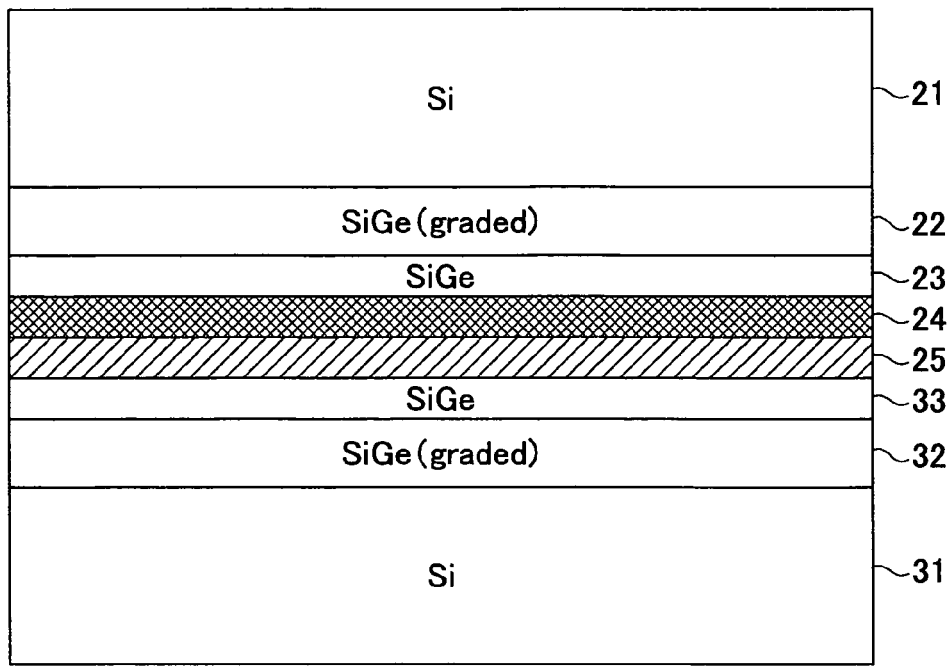
Figure 5C:
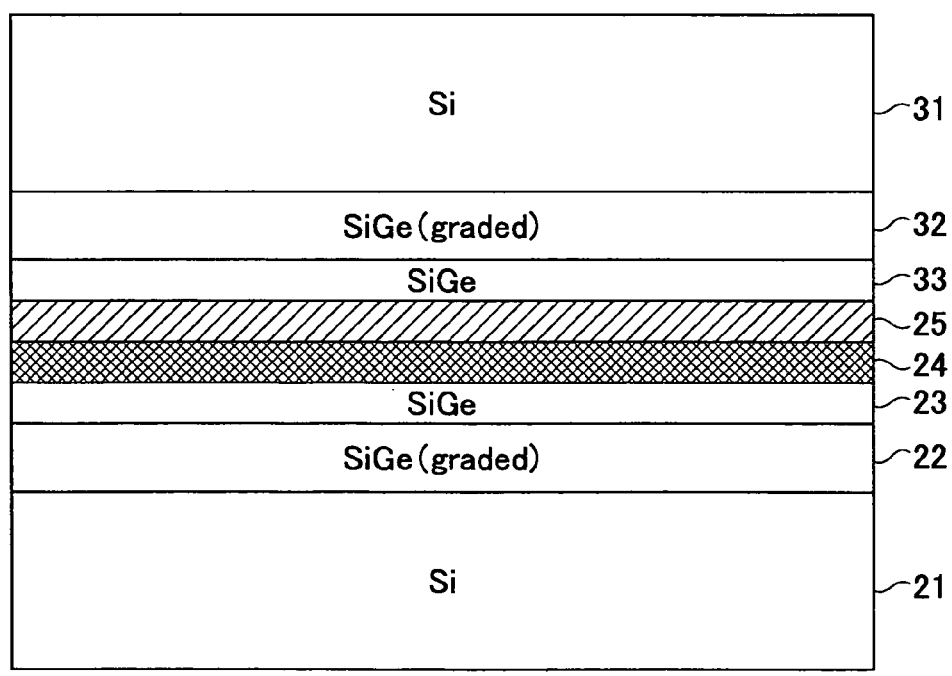

FIG. 4 shows the construction of a strained SOI (silicon-on-insulator) substrate 20 used with the present invention while FIGS. 5A-5C show the fabrication process thereof.

Referring to FIG. 4, the strained SOI substrate 20 is formed on a silicon substrate 21 having a thickness of 600-700 μm and includes a SiGe compositional gradation layer 22 formed on the silicon substrate 21 epitaxially with compositional gradation such that the Ge concentration therein changes continuously from 0% at an interface to the silicon substrate 21 to a predetermined concentration level such as 20 atomic % at a top surface thereof, a SiGe buffer layer 23 formed on the SiGe compositional gradation layer 22 with the thickness of 1-2 μm and the aforementioned predetermined Ge concentration level, an oxide film 24 formed on the SiGe buffer layer 23, and a strained Si device layer 25 formed on the oxide film 24 with a tensile strain accumulated therein.

FIGS. 5A-5C shows the fabrication process of the strained SOI substrate 20 of FIG. 4.

Referring to FIG. 5A, a SiGe compositional gradation layer 32 similar to the SiGe compositional gradation layer 22 of FIG. 4 is formed epitaxially on another silicon substrate 31, wherein the compositional gradation layer 32 carries thereon a substantially unstrained SiGe buffer layer 33 similar to the SiGe buffer layer 23 in epitaxial relationship therewith. Further, a strained Si layer, which is used later as the strained Si device layer 25 and accumulating therein an in-plane tensile strain, is formed on the SiGe buffer layer 33 epitaxially with the thickness of about 15 nm.

Next, in the step of FIG. 5B, a structure of FIG. 4 in which those parts up to the insulation film 24 are formed on the silicon substrate 21 is turned over and is laminated upon the structure of FIG. 5A. Thereby, the insulation film 24 is diffusion-bonded to the foregoing strained Si device layer 25.

Further, in the step of FIG. 5C, the structure of FIG. 5B is turned over, and the silicon substrate 31, the SiGe compositional graded layer 32 and further the SiGe buffer layer 33 are polished out consecutively, to obtain the strained SOI substrate shown in FIG. 4.

Figure 6A:
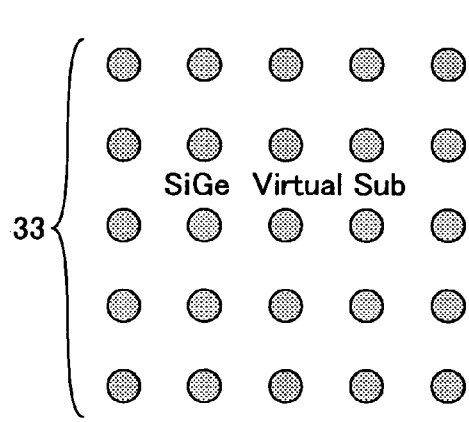
FIGS. 6A-6D are diagrams explaining the fabrication method and principle of the strained SOI substrate of FIG. 5.
Figure 6B:
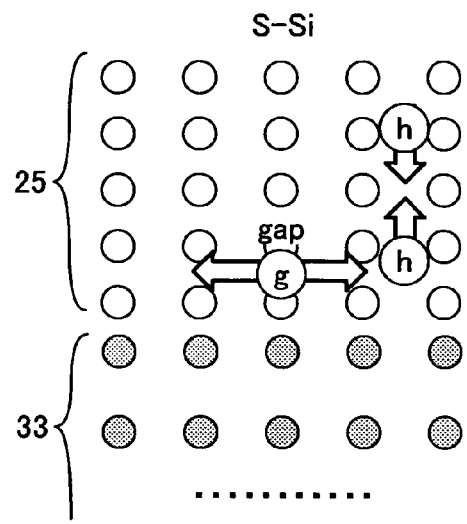
Figure 6C:
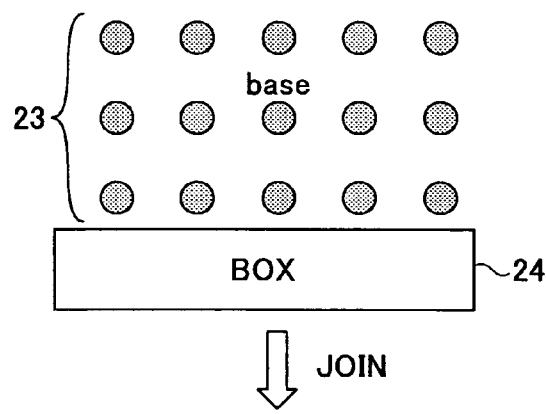
Figure 6C:
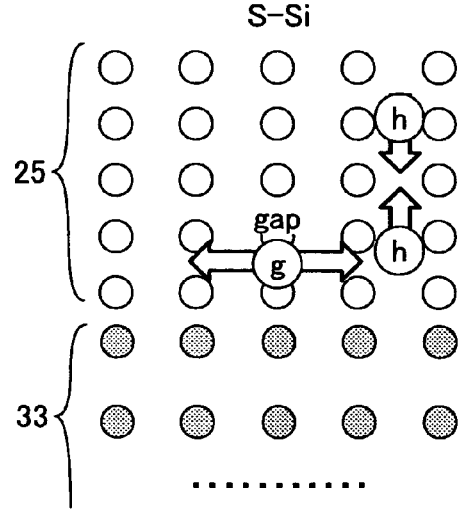

FIGS. 6A-6C are diagrams schematically showing the process from the step of FIG. 5A to the step of FIG. 5C with enlarged scale. In the drawings, the circles represent a Si or Ge atom very schematically.

Referring to FIG. 6A, the SiGe mixed crystal layer 33 is formed epitaxially in the process of FIG. 5A, and the strained Si device layer 25 is formed epitaxially on the SiGe mixed crystal layer 33 in the process of FIG. 6B corresponding to the process of the same FIG. 5A.

Here, it should be noted that the SiGe mixed crystal layer 33 is a substantially unstrained layer and thus has a larger lattice constant, and hence, a larger atomic spacing than those of a Si layer. Because of this, the Si device layer 25 grown epitaxially on the SiGe mixed crystal layer 33 has its crystal lattice expanded as shown by an arrow g, resulting in accumulation of the tensile stress inside the SiGe mixed crystal layer 33. Further, along with the accumulation of the tensile stress, the strained Si device layer 25 undergoes contraction in the direction perpendicular to the substrate surface as shown in FIG. 6B by an arrow h.

Further, an insulation film 24, which may be any of a thermal oxide film or plasma oxide film formed on the SiGe layer 23, is diffusion-bonded to the strained Si device layer 25 of FIG. 6B as shown in FIG. 6C, which corresponds to the process of FIG. 5B.

Figure 6D:
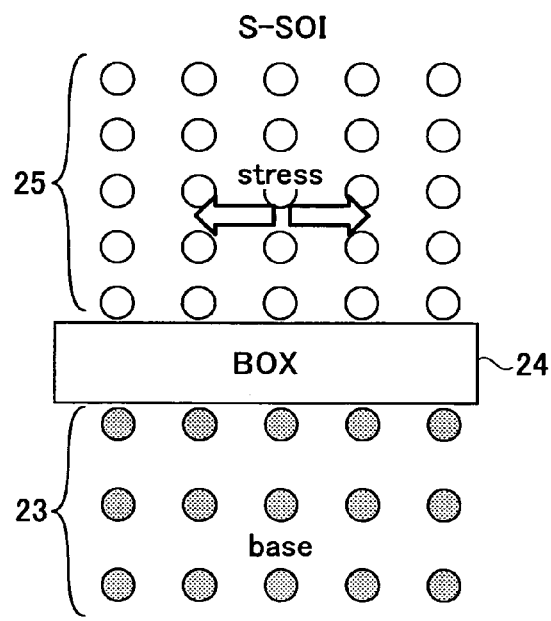

Further, as shown in FIG. 6D, the structure thus obtained is turned over and the layers are removed starting from the silicon substrate 31 up to the SiGe layer 33 by a CMP process or etching process. With this, a strained SOI substrate is obtained such that the strained SOI substrate includes therein a Si single crystal layer 25 accumulating therein the in-plane tensile strain such that the Si single crystal layer 25 is located on the strain-free SiGe layer 23 via the insulation film 24.

Next, the process of fabricating a p-channel MOS transistor on such a strained SOI substrate according to a first embodiment of the present invention will be described with reference to FIGS. 7A-7D.

Figure 7A:
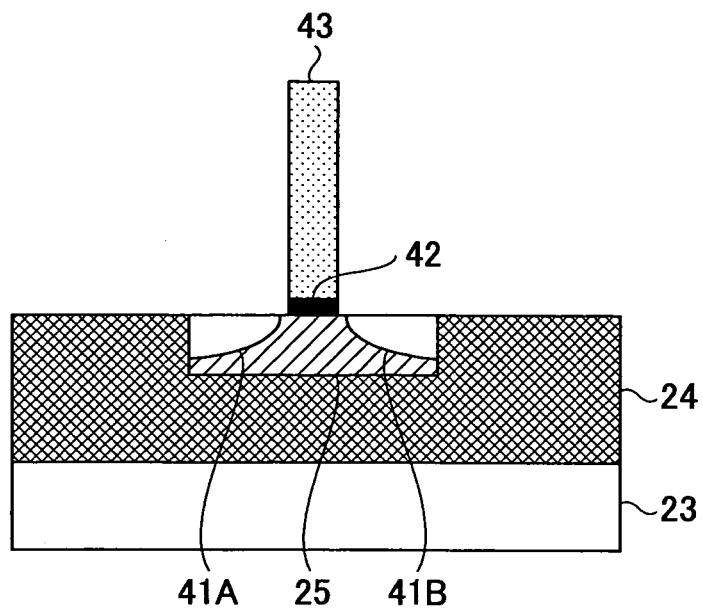
FIGS. 7A-7D are diagrams explaining the fabrication method of a semiconductor device according to the embodiment of the present invention.

Referring to FIG. 7A, the strained Si device layer 25 is doped to an n-type and patterned to form a device region 40A. Further, a polysilicon gate electrode 43 is formed on the strained Si device layer 25 in correspondence to the channel region of the p-channel MOS transistor via a gate insulation film 42, which may be formed of SiON, $SiO_2$ or high-K dielectric.

Further, while using the polysilicon gate electrode 43 as a self-aligned mask, a p-type impurity element such as B+ is injected by an ion implantation process under the acceleration energy of 0.3 keV with the dose of $1\times10^{15}$ $cm^{-2}$. With this, there are formed p-type diffusion regions 41A and 41B in the Si device layer 25 constituting the device region 40A at both lateral sides of the channel region respectively as a source extension region and a drain extension region.

Here, it should be noted that the SiON film used for the gate insulation film 42 can be formed by plasma nitridation of a thermal oxide film or by using a plasma CVD process. Further, in the case of using a high-K dielectric film for the gate insulation film 42, it is possible to use a metal oxide such as $HfO_2$, $ZrO_2$, $Al_2O_3$, or the like, or a metal silicate such as $HfSiO_4$ or $ZrSiO_4$. Thereby, the gate insulation film 42 is formed by an MOCVD process or atomic layer CVD process (so-called ALD process).

Figure 7B:
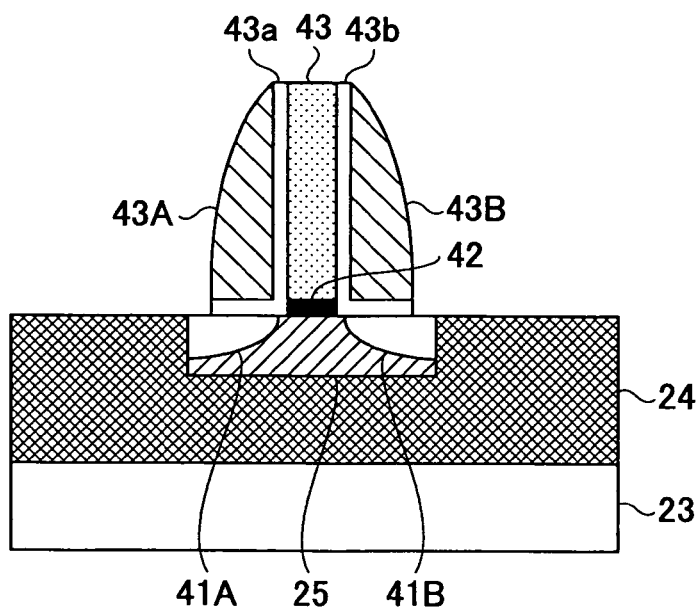

Next, in the step of FIG. 7B, sidewall insulation films 43A and 43B, formed of a material resistant to dry or wet etching of silicon and also resistant to HF processing, are formed respectively on both sidewall surfaces of the gate electrode 43 with the thickness of 30 nm, for example, via CVD oxide films 43a and 43b of the thickness of about 10 nm, such that the CVD oxide film 43a is located also between the strained Si device layer 25 and the sidewall insulation film 43A and such that the oxide film 43b is located also between the strained Si device layer 25 and the sidewall insulation film 43B.

Figure 7C:
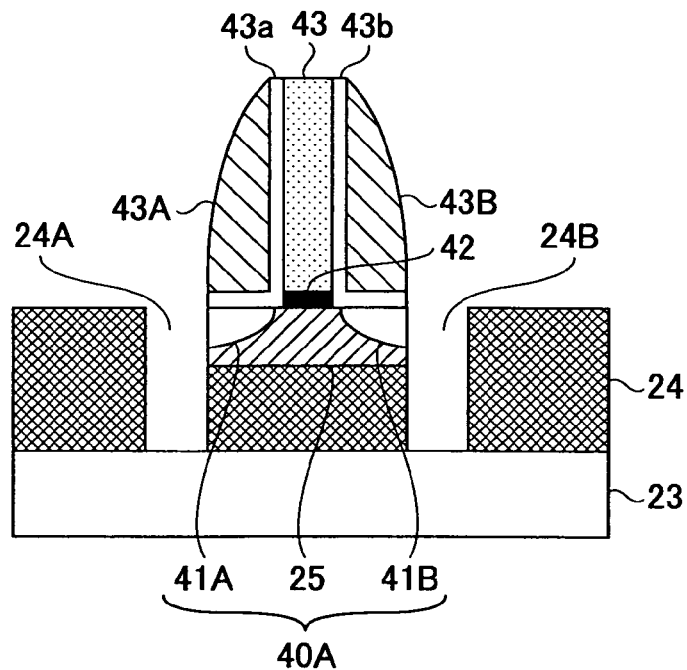

Next, in the step of FIG. 7C, the strained Si device layer 25 and the underlying insulation film 24 are subject to a dry etching process at the parts located outside of the SiN sidewall insulation films 43A and 43B, and openings 24A and 24B are formed so as to expose the SiGe layer 23 of the strained SOI substrate. While not illustrated, the polysilicon gate electrode 43 is protected by an etching mask of SiN, or the like, for avoiding erosion of the polysilicon gate electrode 43 in this step.

Figure 7D:
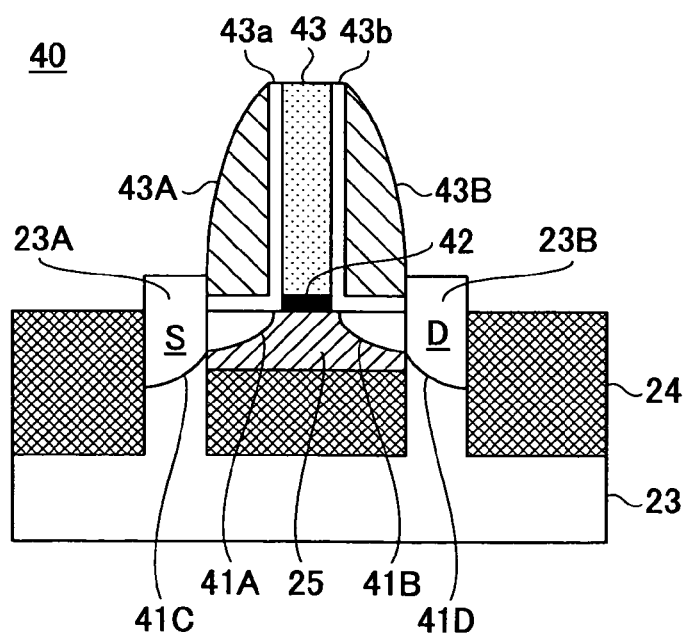

Further, in the step of FIG. 7D, the structure of FIG. 7C is introduced into a low-pressure CVD apparatus and growth of p-type SiGe mixed crystal regions 23A and 23B is made so as to fill the openings 24A and 24B by supplying gases of silane ($SiH_4$) and germane ($GeH_4$) at a temperature lower than 600° C. or lower. Thereby, the growth is made epitaxially such that the SiGe mixed crystal regions 23A and 23B reach at least the level of the top surface of the p-type SiGe mixed crystal regions 23A and 23B. In the illustrated example, the p-type SiGe mixed crystal regions 23A and 23B are formed beyond the top surface of the strained Si device layer 25.

Further, a p-type impurity element such as B+ is introduced by an ion implantation process under the acceleration energy of 0.3 keV with a dose of $1\times10^{15}$ $cm^{-2}$ while using the gate electrode 43 and the sidewall insulation films 43A and 43B as a mask, and as a result, p-type diffusion regions 41C and 41D are formed respectively in continuation with the p-type source extension region 41A and the p-type drain extension region 41B as the source region and the drain region of the p-channel MOS transistor.

Alternatively, it is possible to grow the source and drain regions 41C and 41D in the p-type from the beginning of the epitaxial growth process thereof, by adding a p-type dopant gas such as diborane to the gaseous source of the SiGe mixed crystal regions 23A and 23B.

Figure 8:
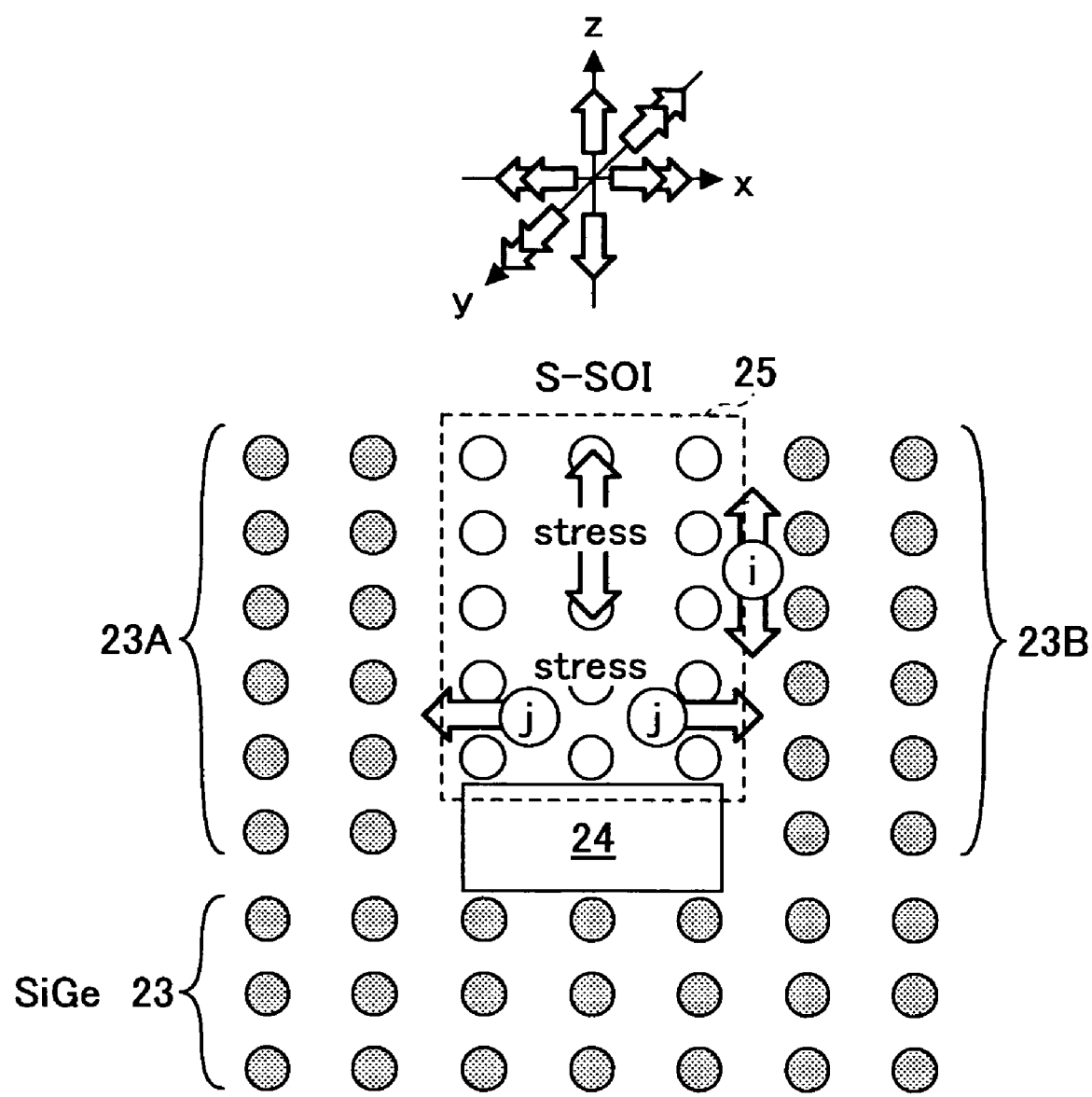
FIG. 8 is a diagram explaining the principle of the semiconductor device according to the first embodiment o the present invention.

FIG. 8 is a diagram explaining the lattice matching between the strained Si device layer 25 and the SiGe mixed crystal regions 23A and 23B, and associated occurrence of the tensile stress. Similarly to FIGS. 6A-6D, FIG. 11 is a schematic diagram in which Si or Ge atoms are represented by circles.

Referring to FIG. 8, the SiGe mixed crystal regions 23A and 23B cause the epitaxial growth starting from the SiGe mixed crystal layer 23, wherein it should be noted that the foregoing epitaxial growth is caused in the present embodiment while maintaining contact with the sidewall surface of the strained Si device layer 25 accumulating therein a tensile stress. Because of this, there is maintained a lattice matching between the SiGe mixed crystal region 23A or 23B and the strained Si device layer 25, and the strained Si device layer 25 is expanded in the direction perpendicular to the substrate surface as shown in the drawing by an arrow i.

As a result, the contraction of the strained Si device layer 25 in the direction perpendicular to the substrate surface explained previously with reference to FIG. 6C by the arrow h is prevented, and the relaxation of the in-plane tensile stress in the layer 25 associated with such a contraction is effectively prevented. Further, the Si crystal lattice in the Si device layer 25 is expanded in the vertical direction to the lattice constant of the SiGe mixed crystal, and the in-plane tensile stress j accumulated in the strained Si device layer 25 is not only prevented from relaxation but enhanced. As a result, it becomes possible to apply a very large tensile stress to the channel region of the p-channel MOS transistor with the use of such a construction.

Figure 9:
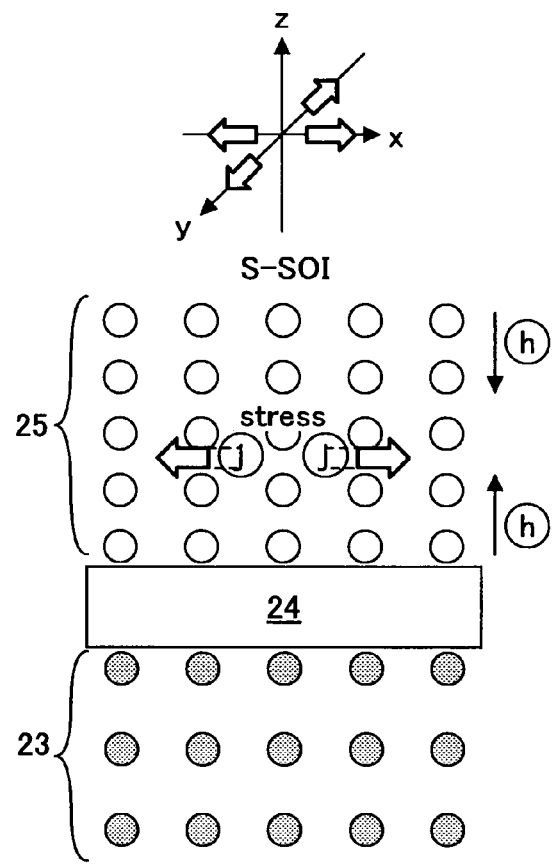
FIG. 9 is a diagram explaining a comparative example corresponding to the first embodiment.

FIG. 9, on the other hand, shows the case in which no such SiGe mixed crystal regions 23A and 23B are formed at both lateral sides of the strained Si device layer 25.

Referring to FIG. 9, there is caused stress relaxation in the strained Si device layer 25 associated with the contraction h explained before, and the in-plane tensile stress j induced in the strained Si device layer 25 is reduced significantly.

With the construction of FIG. 8, it is possible to increase the foregoing in-plate tensile stress j by at least 50% as compared with the case of FIG. 9.

In order to realize the accumulation of the tensile stress and strain in the strained Si device layer 25 in accordance with the mechanism of FIG. 8, it is preferable that the SiGe mixed crystal regions 23A and 23B have an area of at least 50% of the area of the strained Si device layer 25 in the plan view.

Second Embodiment

Figure 10:
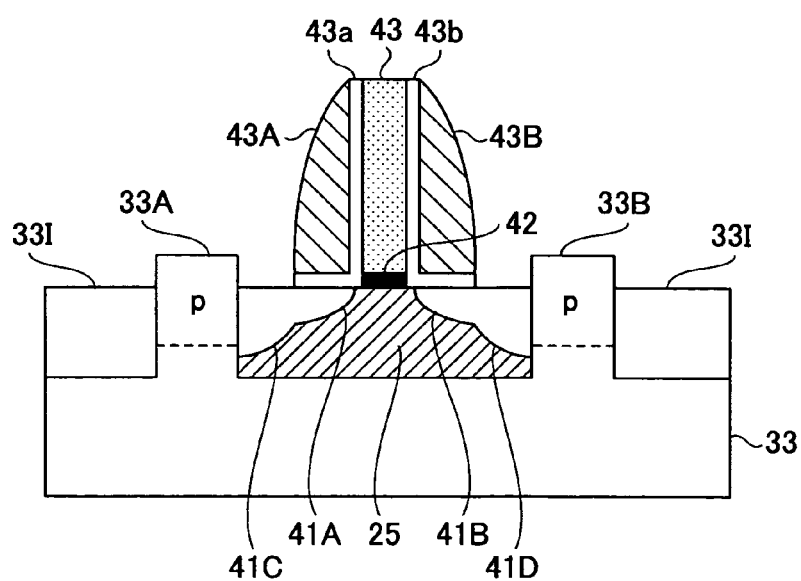
FIG. 10 is a diagram showing the construction of a semiconductor device according to a second embodiment of the present invention.

FIG. 10 shows the construction of a p-channel MOS transistor according to a second embodiment of the present invention, wherein those parts corresponding to the parts explained previously are designated by the same reference numerals and the description thereof will be omitted.

Referring to FIG. 10, the p-channel MOS transistor is formed on a silicon substrate 31 carrying a strained Si layer 25 thereon together with SiGe mixed crystal layers 32 and 33 used with the process of FIG. 5A, wherein illustration of those parts located underneath the strain-free SiGe mixed crystal layer 33 is omitted in FIG. 10.

Thus, the strained Si device layer 25 is doped to the n-type and constitutes a device region, and a polysilicon gate electrode 43 is formed on the strained Si device layer 25 in correspondence to a channel region via a gate insulation film 42 of SiON, SiN or a high-K dielectric.

In the foregoing strained Si device layer 25, there are formed p-type source extension regions 41A and p-type drain extension regions 41B so as to sandwich the channel region right underneath the polysilicon gate electrode 43 laterally.

Further, sidewall insulation films 43A and 43B of SiN or SiON are formed respectively on both sidewall surfaces of the polysilicon gate electrode 43 via CVD oxide films 43a and 43b, and a p-type source region 41C and a p-type drain region 41D are formed in the Si device layer 25 at respective outer sides of the sidewall insulation films 43A and 43B.

In the present embodiment, the strained Si device layer 25 is surrounded by a device isolation insulator 33I, wherein it should be noted that there are formed openings between the device isolation insulator 33I and the strained Si device layer 25, one at the outer side of the source region 41C and the other at the outer side of the drain region 41D. The openings thus formed are filed respectively with SiGe mixed crystal regions 33A and 33B grown epitaxially from the unstrained SiGe mixed crystal layer 33.

Here, it is preferable that the SiGe mixed crystal regions 33A and 33B are formed so as to reach at least the surface of the strained Si device layer 25. In the illustrated example, it can be seen that the SiGe mixed crystal regions 33A and 33B are grown to the level exceeding the surface of the strained Si device layer 25.

Figure 11:
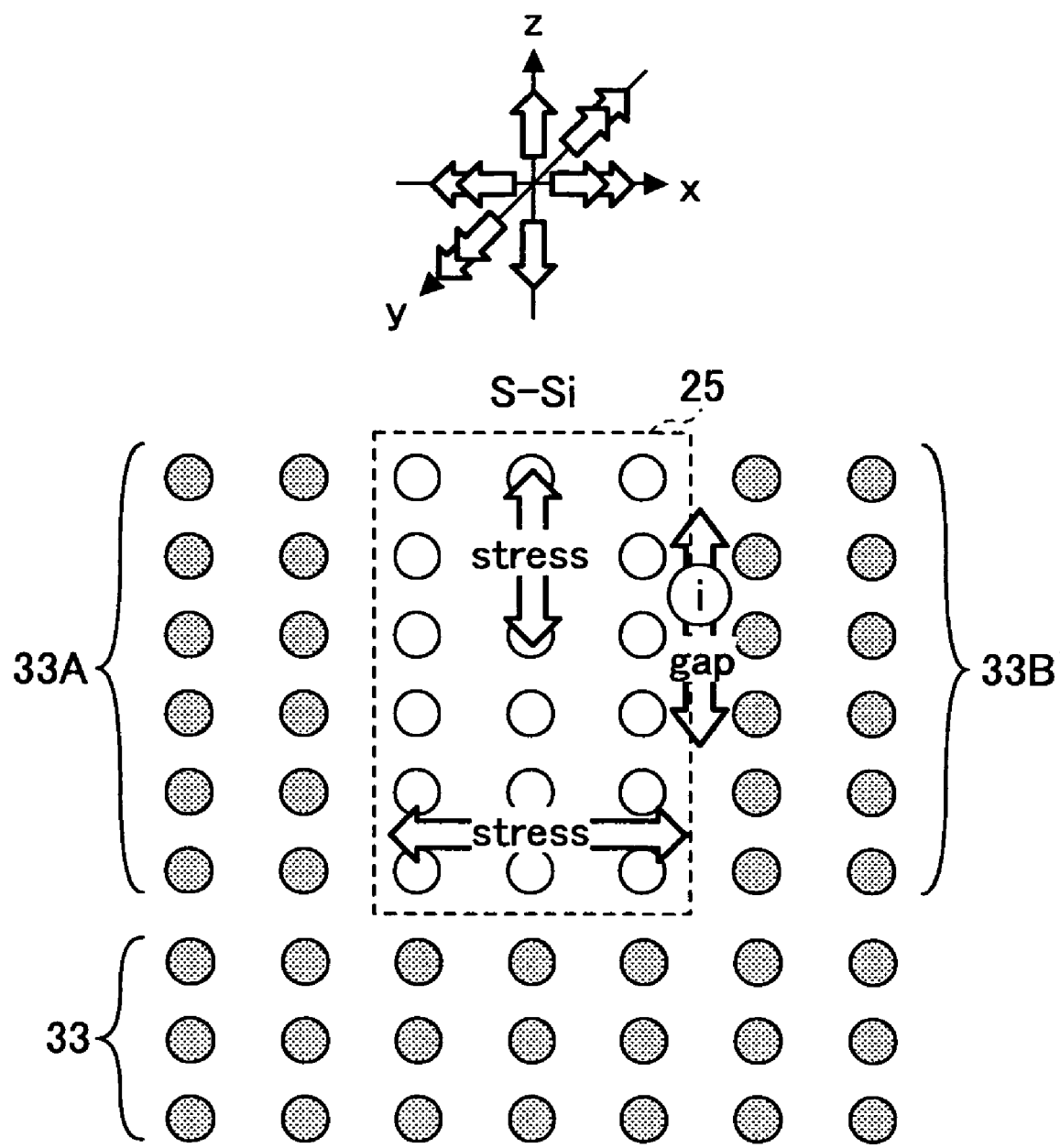
FIG. 11 is a diagram explaining the principle of the semiconductor device according to the second embodiment of the present invention.

FIG. 11 is a schematic diagram explaining the mechanism of stressing in the strained Si device layer 25 of such a p-channel MOS transistor.

Referring to FIG. 11, it can be seen that the SiGe mixed crystal regions 33A and 33B achieve lattice matching with the Si crystal lattice of the strained Si device layer 25 as they are grown epitaxially in the upward direction from the unstrained SiGe mixed crystal layer 33, and as a result, the SiGe mixed crystal regions 33A and 33B function to expand the strained Si device layer 25 in the upward direction as represented by an arrow i.

Here, it should be noted that there is already accumulated a tensile stress in the strained Si device layer 25 as a result of the lattice matching with the unstrained SiGe mixed crystal layer located underneath thereof, and such expansion of the strained Si device layer 25 in the upward direction not only compensates for the stress relaxation effect in the strained Si device layer 25 as explained with reference to FIG. 9 but also enhances the tensile stress therein.

Meanwhile, with the construction of FIG. 10, in which the source and drain regions 41C and 41D are formed in the strained Si device layer 25, there is no particular need of doping the SiGe mixed crystal regions 33A and 33B. On the other hand, it is also possible to dope these regions to the p-type by adding a p-type dopant such as diborane at the time of epitaxial growth thereof.

Thereby, it should be noted that, in the case a SiGe mixed crystal layer doped to p-type forms a junction directly with a Si layer of n-type, there is a possibility that a junction leakage takes place at the p-n junction as a result of recombination of the holes on the valence band of the SiGe mixed crystal and the electrons on the conduction band of the Si layer because of the narrowed bandgap of the SiGe mixed crystal. From this view point, it is preferable to form the p-type region of the SiGe mixed crystal layer not to contact directly with the n-type strained Si device layer 25.

Thus, in the case the SiGe mixed crystal regions 33A and 33B are to be doped to p-type, it is preferable that the p-type regions are confined to the part located upward of the bottom edge of the source and drain diffusion regions 41C and 41D formed in the n-type strained Si device layer 25 as shown in FIG. 10 by a broken line.

Further, in order to utilize the effect of strain enhancement in the strained Si device layer 25 with the mechanism of FIG. 11 more efficiently, it is preferable that the SiGe mixed crystal regions 33A and 33B are formed as closely to the channel region right underneath the gate electrode 43 as possible.

Further, the present invention is not limited to the embodiments described heretofore, but various variations and modifications may be made without departing from the scope of the invention.

What is claimed is:

1. A p-channel MOS transistor, comprising:
   a strained SOI substrate, said strained SOI substrate comprising a SiGe mixed crystal layer and a strained Si layer formed on said SiGe mixed crystal layer via an insulation film, a channel region being included in said strained Si layer;
   a gate electrode formed on said strained Si layer in correspondence to said channel region via a gate insulation film; and
   first and second p-type diffusion regions formed in said strained Si layer at respective first and second sides of said channel region,
   said strained Si layer having first and second sidewall surfaces respectively at said first and second sides thereof,
   a first SiGe mixed crystal region in contact with said first sidewall surface and in continuation to said SiGe mixed crystal layer through a first opening formed in said insulation film,
   a second SiGe mixed crystal region in contact with said second sidewall surface and in continuation to said SiGe mixed crystal layer through a second opening formed in said insulation film,
   said first and second SiGe mixed crystal regions being in lattice matching with said strained silicon layer respectively at said first and second sidewall surfaces.

2. The p-channel MOS transistor as claimed in claim 1, wherein said strained Si layer accumulates therein an in-plane tensile stress acting in a plane of said strained Si layer and further a uniaxial tensile stress acting in a direction perpendicular to said plane of said strained Si layer.

3. The p-channel MOS transistor as claimed in claim 1, wherein each of said first and second SiGe mixed crystal regions is formed so as to reach at least a surface of said strained Si layer.

4. The p-channel MOS transistor as claimed in claim 1, wherein p-type diffusion regions are formed at respective upper parts of said first and second SiGe mixed crystal regions as source and drain regions.

5. The p-channel MOS transistor as claimed in claim 1, wherein said SiGe mixed crystal layer is substantially free from strain at least in an upper part thereof.

6. The p-channel MOS transistor as claimed in claim 1, wherein said SiGe mixed crystal layer is formed epitaxially on a silicon substrate.

7. A method of fabricating a p-channel MOS transistor, said p-channel MOS transistor comprising a strained SOI substrate, said strained SOI substrate comprising a SiGe mixed crystal layer and a strained Si layer formed on said SiGe mixed crystal layer via an insulation film, a channel region being included in said strained Si layer, a gate electrode formed on said strained Si layer in correspondence to said channel region via a gate insulation film, and first and second p-type diffusion regions formed in said strained Si layer at respective first and second sides of said channel region, said method comprising the steps of:
   forming first and second openings in said strained Si layer respectively at said first and second sides so as to expose said SiGe mixed crystal layer, said first and second openings being defined respectively by first and second sidewall surfaces; and
   growing first and second SiGe mixed crystal regions respectively at said first and second openings epitaxially, such that said first SiGe mixed crystal region makes contact with said first sidewall surface and such that said second SiGe mixed crystal region makes contact with said second sidewall surface.

* * * * *